(12) United States Patent
Kim (10) Patent No.: US 9,029,849 B2
(45) Date of Patent: May 12, 2015

(54) ORGANIC LIGHT EMITTING DIODE DISPLAY DEVICE AND METHOD FOR DRIVING THE SAME

(71) Applicant: LG Display Co., Ltd., Seoul (KR)

(72) Inventor: Binn Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/268,127

(22) Filed: May 2, 2014

(65) Prior Publication Data

US 2014/0326969 A1    Nov. 6, 2014

(30) Foreign Application Priority Data

May 6, 2013  (KR) .................. 10-2013-0050414

(51) Int. Cl.
*H01L 27/32* (2006.01)

(52) U.S. Cl.
CPC ........ *H01L 27/3262* (2013.01); *H01L 27/3265* (2013.01)

(58) Field of Classification Search
None
See application file for complete search history.

(56) References Cited

U.S. PATENT DOCUMENTS

| | | | |
|---|---|---|---|
| 8,441,417 B2 * | 5/2013 | Uchino et al. | 345/76 |
| 2012/0069059 A1 * | 3/2012 | Lee | 345/690 |
| 2013/0082910 A1 * | 4/2013 | Lee | 345/76 |
| 2013/0088417 A1 * | 4/2013 | Kim et al. | 345/82 |
| 2013/0335391 A1 * | 12/2013 | Kim | 345/211 |

* cited by examiner

*Primary Examiner* — Joseph Schoenholtz (74) *Attorney, Agent, or Firm* — Morgan, Lewis & Bockius LLP (57) ABSTRACT

An organic light emitting diode (OLED) display device is provided. The OLED display device includes a first transistor configured to supply a data voltage to a first node, a second transistor connected between the first node and a second node, a third transistor configured to supply a reference voltage to the third node, a fourth transistor configured to supply an initialization voltage to the second node, a fifth transistor configured to supply the reference voltage to the second node, a driving transistor configured to include a drain receiving a high-level source voltage, a source connected to the second node, and a gate connected to the third node, a first capacitor connected between the first node and the third node, a second capacitor connected between the second node and the third node, and an OLED configured to include an anode connected to the second node.

12 Claims, 10 Drawing Sheets

ORGANIC LIGHT EMITTING DIODE DISPLAY DEVICE AND METHOD FOR DRIVING THE SAME

CROSS-REFERENCE TO RELATED APPLICATIONS

This application claims the benefit of the Korean Patent Application No. 10-2013-0050414 filed on May 6, 2013, which is hereby incorporated by reference as if fully set forth herein.

BACKGROUND OF THE INVENTION

1. Field of the Invention

The present invention relates to a display device, and more particularly, to an organic light emitting diode (OLED) display device and a method of driving the same.

2. Discussion of the Related Art

With the advancement of information-oriented society, various requirements for display field are increasing, and thus, research is being done on various flat panel display devices that are thin and light, and have low power consumption. For example, the flat panel display devices are categorized into liquid crystal display (LCD) devices, plasma display panel (PDP) devices, OLED display devices, etc.

Especially, OLED display devices that are being actively studied recently apply data voltage (Vdata) having various levels to respective pixels to display different grayscale levels, thereby realizing an image.

To this end, each of a plurality of pixels includes one or more capacitors, an OLED, and a driving transistor that are current control elements. Especially, a current flowing in the organic light emitting diode OLED is controlled by the driving transistor, and the threshold voltage deviation of the driving transistor and the amount of a current flowing in the organic light emitting diode OLED are changed by various parameters, causing the luminance non-uniformity of a screen.

In detail, the threshold voltage deviation of the driving transistor occurs because the characteristic of the driving transistor is changed according to the manufacturing process variable of the driving transistor, and a deviation of a low-level source voltage is caused by an IR drop of a power supply line.

SUMMARY OF THE INVENTION

Accordingly, the present invention is directed to provide an OLED display device and a method of driving the same that substantially obviate one or more problems due to limitations and disadvantages of the related art.

An aspect of the present invention is directed to provide an OLED display device that can compensate for a threshold voltage deviation and a low-level source voltage deviation.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, an OLED display device includes a first transistor configured to supply a data voltage to a first node according to a scan signal; a second transistor connected between the first node and a second node, and configured to connect the first node and the second node according to a first control signal; a third transistor configured to supply a reference voltage to the third node according to the first control signal; a fourth transistor configured to supply an initialization voltage to the second node according to a second control signal; a fifth transistor configured to supply the reference voltage to the second node according to the scan signal; a driving transistor configured to include a drain receiving a high-level source voltage, a source connected to the second node, and a gate connected to the third node; a first capacitor connected between the first node and the third node; a second capacitor connected between the second node and the third node, and configured to store a threshold voltage of the driving transistor; and an OLED configured to include an anode connected to the second node, wherein emission of light from the OLED is controlled according to a current flowing in the driving transistor.

In another aspect, a method of an organic light emitting diode (OLED) display device that includes first to fifth transistors, a driving transistor, first and second capacitors, and an OLED, includes, while the second to fourth transistors are turned on, supplying an initialization voltage to a second node connected to one end of the second capacitor, transferring the initialization voltage to a first node connected to one end of the first capacitor, and supplying a reference voltage to a third node which is connected to the other end of the first capacitor and a gate of the driving transistor; while the second and third transistors are turned on, storing a threshold voltage of the driving transistor in the second capacitor which is connected between the second and third nodes; while the first and fifth transistors are turned on, supplying a data voltage to the first node; and while the first to fifth transistors are turned off, emitting light from the OLED connected to the second node that is a source of the driving transistor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principles of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Figure 1:
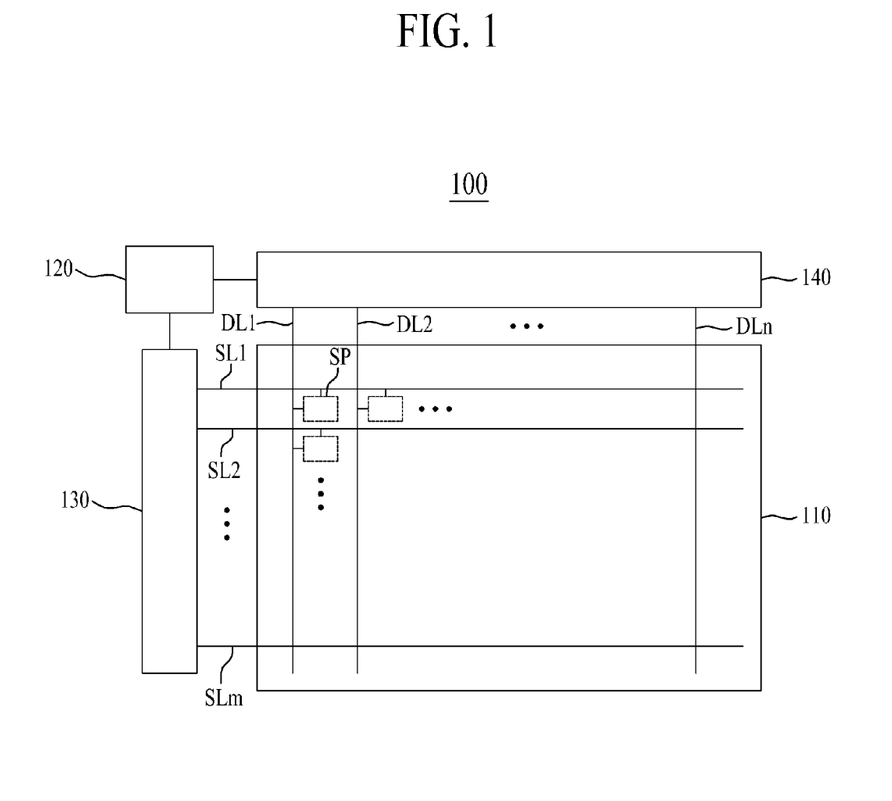
FIG. 1 is a diagram schematically illustrating a configuration of an OLED display device according to embodiments of the present invention.

FIG. 1 is a diagram schematically illustrating a configuration of an OLED display device according to embodiments of the present invention.

As illustrated in FIG. 1, an OLED display device 100 according to embodiments of the present invention includes a panel 110, a timing controller 120, a scan driver 130, and a data driver 140.

The panel 110 includes a plurality of sub-pixels SP that are arranged in a matrix type. The sub-pixels SP included in the panel 110 emit light according to respective scan signals (which are supplied through a plurality of scan lines SL1 to SLm from the scan driver 120) and respective data signals that are supplied through a plurality of data lines DL1 to DLn from the data driver 130. Also, the emission of the sub-pixels SP may be controlled by the scan signal, data signals, a plurality of first control signals Em supplied from the scan driver 130 through a plurality of first control lines (not shown), and a plurality of second control signals H supplied from the scan driver 130 through a plurality of second control lines (not shown).

To this end, one sub-pixel includes an organic light emitting diode, and a plurality of transistors and capacitors for driving the organic light emitting diode. The detailed configuration of each of the sub-pixels SP will be described in detail with reference to FIG. 2.

The timing controller 120 receives a vertical sync signal, a horizontal sync signal, a data enable signal, a clock signal, and video signals from the outside. Also, the timing controller 120 aligns external input video signals to digital image data in units of a frame.

For example, the timing controller 120 controls the operational timing of each of the scan driver 130 and the data driver 140 with a timing signal that includes the vertical sync signal, the horizontal sync signal, the data enable signal, and the clock signal.

To this end, the timing controller 120 generates a gate control signal for controlling the operational timing of the scan driver 130 and a data control signal for controlling the operational timing of the data driver 140.

The scan driver 120 generates a scan signal "Scan" that enables the operations of transistors included in each of the sub-pixels SP included in the panel 110, according to the gate control signal supplied from the timing controller 120, and supplies the scan signal "Scan" to the panel 110 through the scan lines SL. Also, the scan driver 120 generates the first and second control signals Em and H as a type of scan signal, and supplies the first and second control signals Em and H to the panel 100 through the respective first and second control lines (not shown). Hereinafter, a scan signal applied through an nth scan line of the scan lines is assumed as a scan signal Scan[n].

The data driver 130 generates data signals with the digital image data and the data control signal that are supplied from the timing controller 120, and supplies the generated data signals to the panel 110 through the respective data lines DL.

Hereinafter, the detailed configuration of each sub-pixel will be described in detail with reference to FIGS. 1 and 2.

Figure 2:
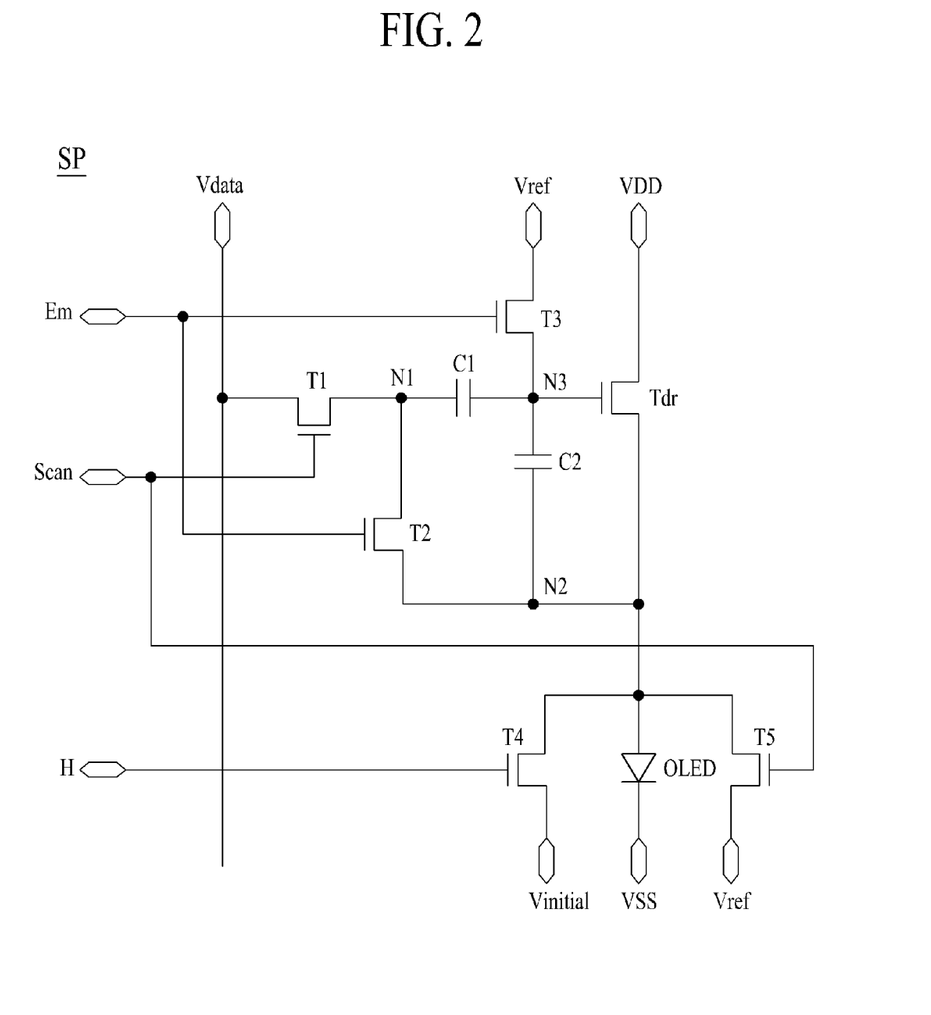
FIG. 2 is a diagram schematically illustrating an equivalent circuit of a sub-pixel of FIG. 1.

FIG. 2 is a diagram schematically illustrating an equivalent circuit of a sub-pixel of FIG. 1.

As illustrated in FIG. 2, each sub-pixel SP may include first to fifth transistors T1 to T5, a driving transistor Tdr, first and second capacitors C1 and C2, and an organic light emitting diode (OLED).

The first to fifth transistors T1 to T5 and the driving transistor Tdr, as illustrated in FIG. 2, are NMOS transistors, but are not limited thereto. As another example, a PMOS transistor may be applied thereto, in which case a voltage for turning on the NMOS transistor has a polarity opposite to that of a voltage for turning on the PMOS transistor.

First, the scan signal Scan[n] is applied to a gate of the first transistor T1, a data voltage Vdata is applied to a drain of the first transistor T1, the and a source of the first transistor T1 is connected to a first node N1 which is one end of each of the first and second capacitors C1 and C2.

For example, the data voltage Vdata may be applied to a drain of the first transistor T1 through a data line DL, and the first transistor T1 may be turned on according to the scan signal Scan[n] to supply the data voltage Vdata to the first node N1.

Therefore, the first transistor T1 may be turned on according to the scan signal supplied through the scan line SL, and an operation of the first transistor T1 may be controlled.

Here, a plurality of the data voltages Vdata may be different voltages which are applied at every one horizontal period (1H). For example, when an n-1st data voltage Vdata[n-1] is applied to the drain of the first transistor T1 during one horizontal period (1H), an nth data voltage Vdata[n] may be applied to the drain of the first transistor T1 during the next one horizontal period (1H), and in succession, successive data voltages may be continuously applied to the drain of the first transistor T1 at every one horizontal period (1H).

The second transistor T2 is connected between the first node N1 and a second node N2 that is the other end of the second capacitor C2, and the first control signal Em is applied to a gate of the second transistor T2.

For example, the second transistor T2 is turned on according to the first control signal Em, and is connected to the first and second nodes N1 and N2, which maintain the same voltage.

Therefore, the second transistor T2 may be turned on according to the first control signal Em supplied through a first control line (not shown), and an operation of the second transistor T2 may be controlled.

A reference voltage Vref is supplied to a third node N3, which is the other end of the first capacitor C1 and is connected to a gate of the driving transistor Tdr, according to the first control signal Em applied to a gate of the third transistor T3.

For example, the third transistor T3 may be turned on according to the first control signal Em, and transfers the reference voltage Vref to the third node N3 to initialize, to the reference voltage Vref, a voltage at the gate of the driving transistor Tdr connected to the third node N3.

Therefore, the third transistor T3 is turned on according to the first control signal Em supplied through a first control line (not shown), and an operation of the third transistor T3 is controlled. The third transistor T3 initializes a voltage of the third node to the reference voltage Vref.

An initialization voltage Vinitial is supplied to the second node N2, connected to a source of the driving transistor Tdr, according to a second control signal H applied to a gate of the fourth transistor T4.

For example, the fourth transistor T4 may be turned on according to the second control signal H, and transfers the initialization voltage Vinitial to the second node N2 to initialize, to the initialization voltage Vinitial, a voltage at the source of the driving transistor Tdr connected to the second node N2. Here, the initialization voltage Vinitial may be lower than a threshold voltage of the organic light emitting diode OLED.

Therefore, the fourth transistor T4 is turned on according to the second control signal H supplied through a second control line (not shown), and an operation of the fourth transistor T4 is controlled. The fourth transistor T4 initializes a voltage of the second node to the initialization voltage Vinitial, and thus disallows a current to flow the organic light emitting diode OLED, whereby the organic light emitting diode OLED does not emit light.

The scan signal is applied to a gate of the fifth transistor T5, and the reference voltage Vref is applied to a source of the fifth transistor T5. A drain of the fifth transistor T5 is connected to the second node N2. In another embodiment, instead of the reference voltage Vref, the initialization voltage Vinitial or a low-level source voltage VSS may be applied to the source of the fifth transistor T5.

For example, the fifth transistor T5 is turned on according to the scan signal, and supplies a voltage "Vref+a" equal to or higher than the reference voltage Vref to the second node N2. This is because the driving transistor Tdr and the fifth transistor T5 are simultaneously turned on, and thus, a current path is formed between a high-level source voltage VDD terminal and a reference voltage Vref terminal. Here, the voltage "a" is a voltage with the consideration of a drop of a voltage caused by the current path, and may be changed according to a voltage at the gate of the driving transistor Tdr.

Therefore, the fifth transistor T5 may be turned on according to the scan signal supplied through the scan line SL, and an operation of the fifth transistor T5 may be controlled.

The first capacitor C1 may be connected between the first and third nodes N1 and N3, and acts as a storage capacitor that holds a data voltage during one frame to allow a constant amount of current to flow in the organic light emitting diode OLED, thereby maintaining a constant gray scale expressed by the organic light emitting diode OLED. Also, the second transistor T2 is turned on and connected to the first and second nodes N1 and N2, and thus, the second transistor T2 acts as a sensing capacitor that is used to sense a threshold voltage "Vth" of the driving transistor Tdr.

The second transistor T2 is connected between the second and third nodes N2 and N3, and acts as the sensing capacitor that is used to sense the threshold voltage "Vth" of the driving transistor Tdr.

The high-level source voltage VDD is applied to a drain of the driving transistor Tdr, the gate of the driving transistor Tdr is connected to the third node N3, and the source of the driving transistor Tdr is connected to the second node N2 that is an anode of the organic light emitting diode OLED and is the drain electrode of each of the fourth and fifth transistors T4 and T5.

For example, the amount of a current flowing in the organic light emitting diode OLED may be adjusted according to a voltage applied to the third node N3 that is the gate of the driving transistor Tdr, and a voltage applied to the third node N3 may be determined based on the data voltage Vdata, the reference voltage Vref, the threshold voltage "Vth" of the driving transistor Tdr, and a capacitance of each of the first and second capacitors C1 and C2. For example, the amount of a current flowing in the organic light emitting diode OLED may be proportional to a level of the data voltage Vdata.

Therefore, the OLED display device according to embodiments of the present invention applies various levels of data voltages Vdata to the sub-pixels SP to express different gray scales, thereby displaying an image.

As described above, the OLED display device according to embodiments of the present invention has a source follower structure in which a load is connected to the source of the driving transistor Tdr without a fixed voltage being applied to the source of the driving transistor Tdr. Therefore, the OLED display device according to embodiments of the present invention senses the threshold voltage of the driving transistor Tdr even when the threshold voltage has a negative polarity, and thus can compensate for a deviation of the threshold voltage irrespective of a polarity of the threshold voltage.

In other words, the OLED display device according to embodiments of the present invention compensates for a change (caused by a positive or negative threshold voltage) in a current which flows in the organic light emitting diode OLED, thereby maintaining a constant current based on the data voltage Vdata regardless of the deviation of the threshold voltage.

The anode of the organic light emitting diode OLED may be connected to the second node N2, and the low-level source voltage VSS may be applied to a cathode of the organic light emitting diode OLED.

Hereinafter, the operation of each sub-pixel included in the OLED display device according to embodiments of the present invention will be described in detail with reference to FIGS. 3 and 5A to 5D.

Figure 3:
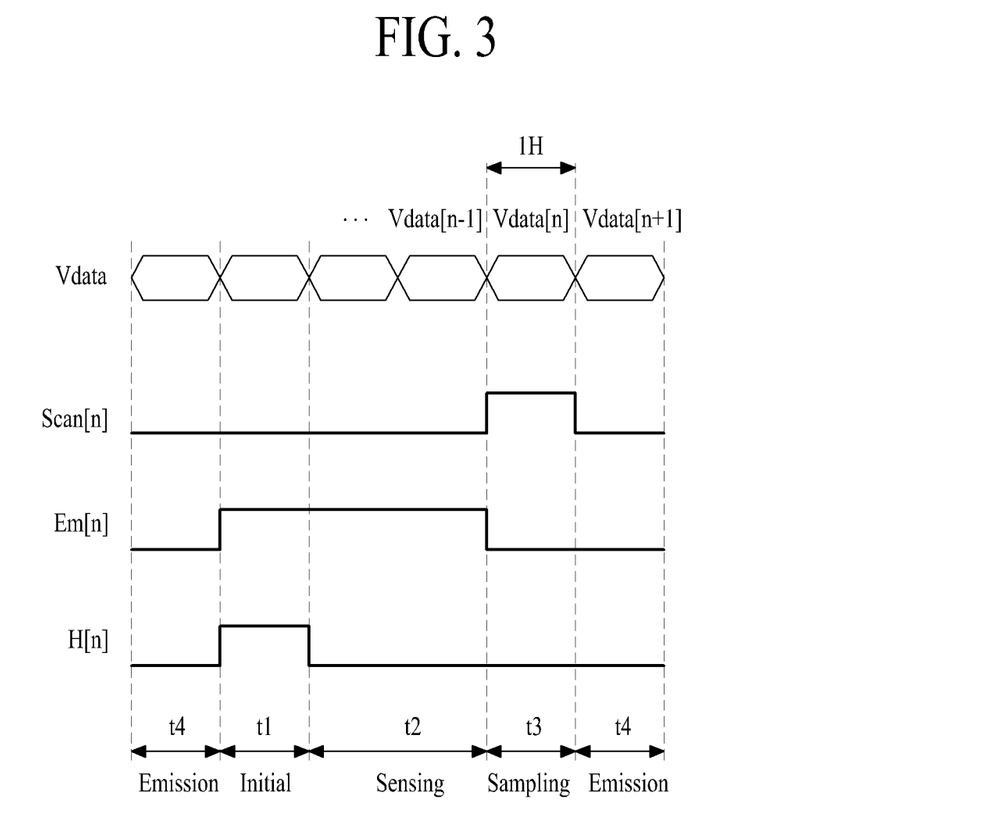
FIG. 3 is a timing chart according to an embodiment of each of control signals supplied to the equivalent circuit of FIG. 2.

FIG. 3 is a timing chart according to an embodiment of each of control signals supplied to the equivalent circuit of FIG. 2. FIGS. 5A to 5D are diagrams for describing a method of driving an OLED display device according to embodiments of the present invention.

As shown in FIG. 3, the OLED display device according to embodiments of the present invention may divide into an initial period t1, a sensing period t2, a sampling period t3, and an emission period t4, and operate during the respective periods t1 to t4. A time of each of the initial period t1, sensing period t2, sampling period t3, and emission period t4 may be one horizontal period (1H).

During the initial period t1, as shown in FIG. 3, the scan signal Scan[n] having a low level and the first and second control signals Em[n] and H[n] having a high level are applied to a sub-pixel.

Figure 5A:
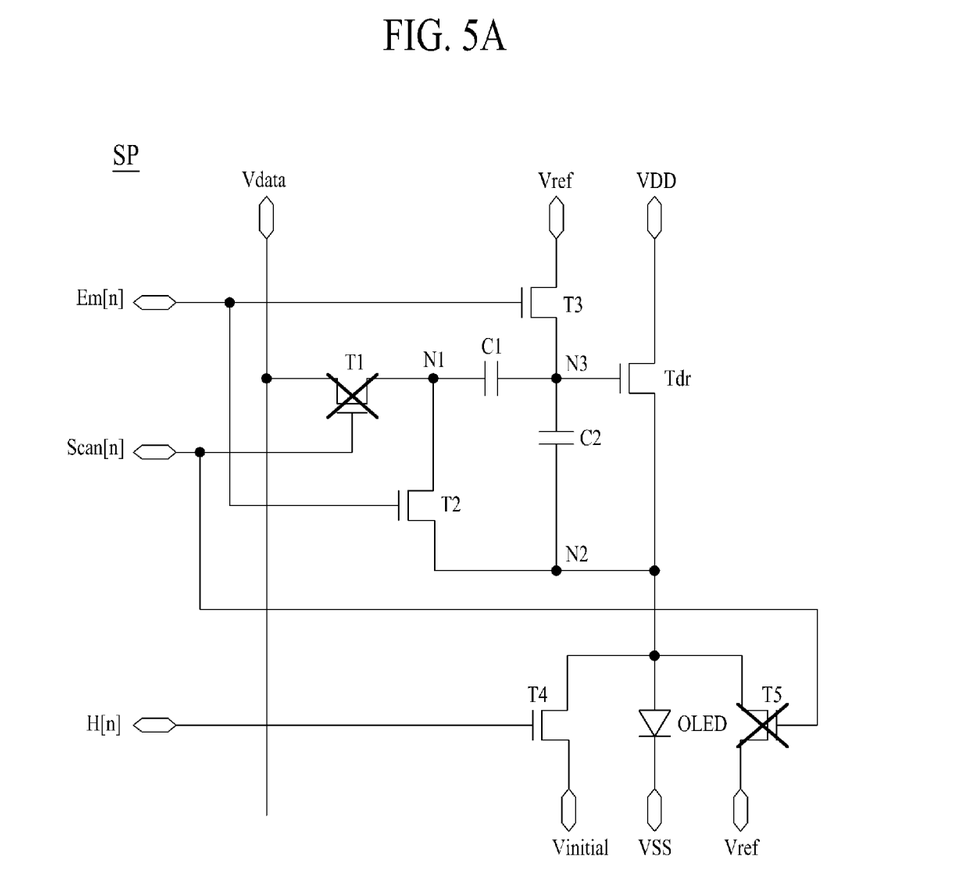
FIGS. 5A to 5D are diagrams for describing a method of driving an OLED display device according to embodiments of the present invention.

Therefore, as illustrated in FIG. 5A, the first and fifth transistors T1 and T5 may be turned off by the scan signal Scan[n] having a low level, the second and third transistors T2 and T3 may be turned on by the first control signal Em[n] having a high level, and the fourth transistor T4 may be turned on by the second control signal H[n] having a high level.

For example, during the initial period t1, the third transistor T3 may be turned on, and thus, a current path may be formed between the third node N3 and the reference voltage Vref terminal, whereby a voltage of the third node N3 may be initialized to the reference voltage Vref. Also, the fourth transistor T4 may be turned on, and thus, a current path may be formed between the second node N2 and the initialization voltage Vinitial terminal, whereby a voltage of the second node N2 may be initialized to the initialization voltage Vinitial. In addition, the second transistor T2 may be turned on, and thus, a current path may be formed between the second node N2 and the first node N1, whereby a voltage of the first node N1 may be initialized to the initialization voltage Vinitial that is the voltage of the second node N2.

Here, the initialization voltage Vinitial may be set as a voltage lower than the sum of a threshold voltage "Vth_oled"

of the organic light emitting diode OLED and the low-level source voltage VSS applied to the cathode of organic light emitting diode OLED (Vinitial<Vth_oled+VSS). Also, the threshold voltage "Vth_oled" of the organic light emitting diode OLED is a voltage with which the organic light emitting diode OLED starts to emit light, and when a voltage lower than the threshold voltage "Vth_oled" of the organic light emitting diode OLED is applied as a voltage between both ends of the organic light emitting diode OLED, the organic light emitting diode OLED does not emit light.

In other words, during the initial period t1, the third node N3 is initialized to the reference voltage Vref, and the first and second nodes N1 and N2 are initialized to the initialization voltage Vinitial, thereby turning off the organic light emitting diode OLED.

With further reference to FIG. 3, during the sensing period t2, the scan signal Scan[n] and second control signal H[n] having a low level and the first control signal Em[n] having a high level are applied to the sub-pixel.

Figure 5B:
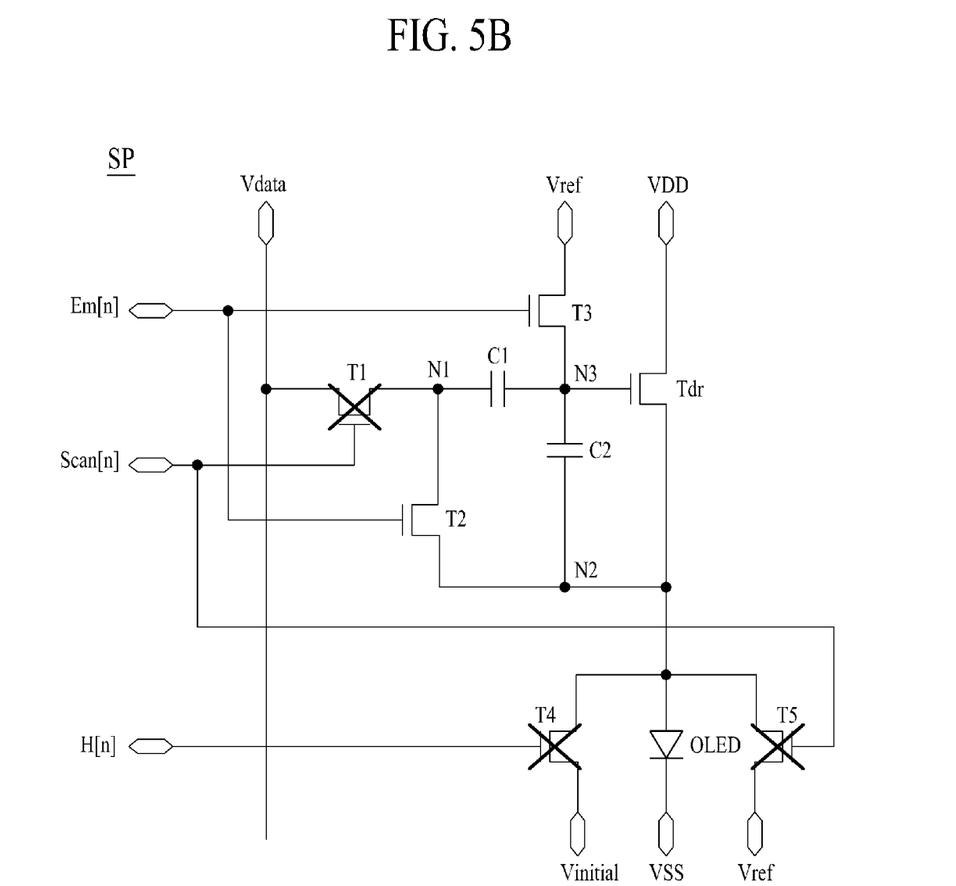

Therefore, as illustrated in FIG. 5B, the second and third transistors T2 and T3 may be turned on by the first control signal Em[n] having a high level, and the first, fourth, and fifth transistors T1, T4 and T5 may be turned off by the scan signal Scan[n] and second control signal H[n] having a low level.

For example, during the sensing period t2, the voltage of the third node N3 may maintain the reference voltage Ref, and the voltage of the second node N2 maintain a voltage "Vref−Vth" equal to a difference between the reference voltage Vref and the threshold voltage "Vth" of the driving transistor Tdr. Therefore, the threshold voltage "Vth" of the driving transistor Tdr may be stored in the second capacitor C2. Also, the second transistor T2 maintains a turn-on state, and thus, the second node N2 is connected to the first node N1, whereby the voltage of the first node N1 may maintain the voltage "Vref−Vth" equal to the voltage of the second node N2. Accordingly, the threshold voltage "Vth" of the driving transistor Tdr may be stored in the first capacitor C1 identically to the second capacitor C2.

Here, the voltage "Vref−Vth" that is the voltage of each of the first and second nodes N1 and N2 may be set as a voltage lower than the sum of the threshold voltage "Vth_oled" of the organic light emitting diode OLED and the low-level source voltage VSS at the cathode of organic light emitting diode OLED (Vref−Vth<Vth_oled+VSS).

Therefore, during the sensing period t2, since the voltage of the second node N2 maintains the voltage "Vref−Vth", the organic light emitting diode OLED maintains a turn-off state.

A time of the sensing period t2, in which the threshold voltage "Vth" of the driving transistor is sensed, may be adjusted by adjusting a pulse width of the first control signal Em of FIG. 3. Accordingly, by increasing the pulse width of the first control signal Em, the threshold voltage deviation of the driving transistor may be more accurately compensated for.

With further reference to FIG. 3, during the sampling period t3, the scan signal Scan[n] having a high level and the first and second control signals Em[n] and H[n] having a low level are applied to the sub-pixel.

Figure 5C:
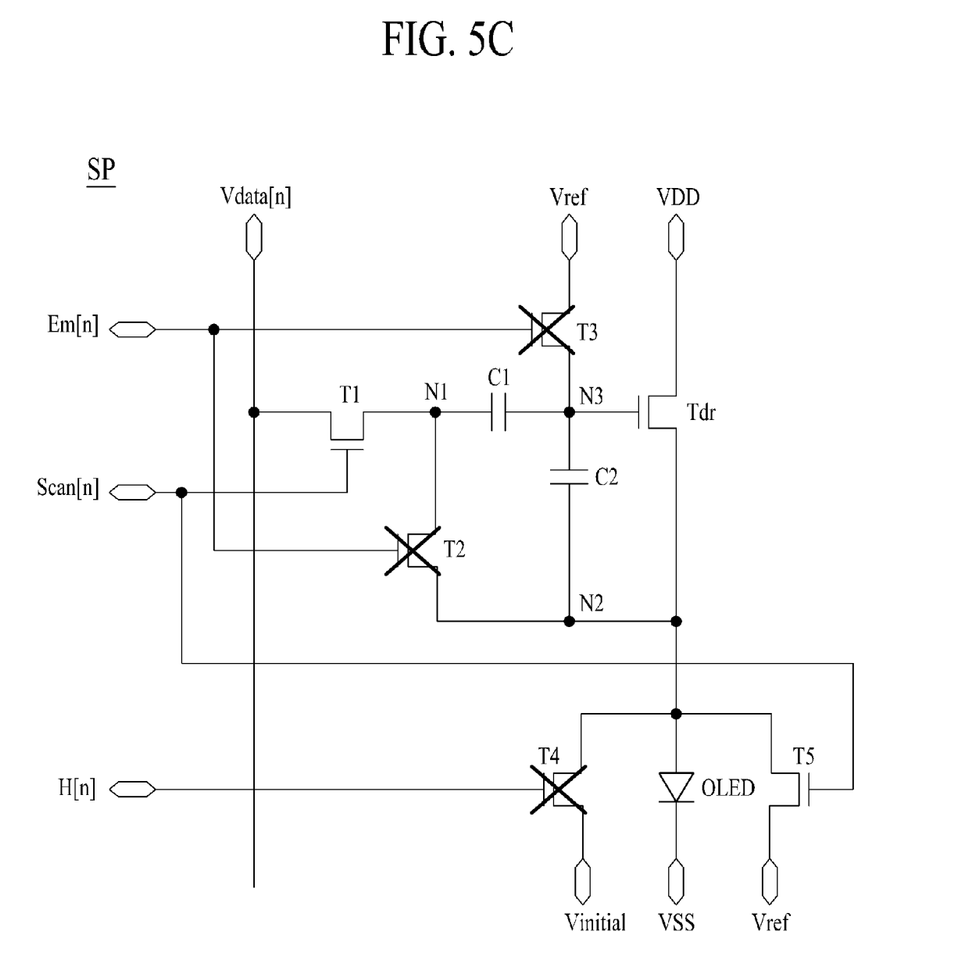

Therefore, as illustrated in FIG. 5C, the first and fifth transistors T1 and T5 are turned on by the scan signal Scan[n] having a high level, the second and the third transistors T2 and T3 are turned off by the first control signal Em[n] having a low level, and the fourth transistor T4 is turned off by the second control signal H[n] having a low level. An nth data voltage Vdata[n] is applied to the drain of the first transistor T1 through the data line.

Also, during the sampling period t3, since the first transistor T1 is turned on, the nth data voltage Vdata[n] may be applied to the first node N1 through the data line.

For example, during the sensing period t2, the voltage of the first node N1 that is the one end of the first capacitor C1 maintains the voltage "Vref−Vth", and then, during the sampling period t3, the voltage of the first node N1 is changed to the nth data voltage, whereby the voltage of the third node N3 that is the other end of the first capacitor C1 is changed. However, a voltage stored in the first capacitor C1 is maintained without any change, and since the first and second capacitors C1 and C2 are connected in series, the voltage of the third node N3 is determined by using a ratio "c1/(c1+c2)" of a capacitance "c1" of the first capacitor C1 and a capacitance "c2" of the second capacitor C2. Therefore, the voltage of the third node N3 may be expressed as "{Vdata[n]−(Vref−Vth)} {c1/(c1+c2)}+Vref" by using the voltage "Vref" of the third node N3, a voltage change "Vdata[n]−(Vref−Vth)" of the first node N1, and the ratio "c1/(c1+c2)" of the capacitance "c1" of the first capacitor C1 and the capacitance "c2" of the second capacitor C2, during the sensing period t2.

The capacitance ratio of the first and second capacitors affects a current Ioled flowing in the organic light emitting diode OLED, and thus, an influence of the threshold voltage of the driving transistor can be reduced by adjusting the capacitance ratio that affects the current Ioled flowing in the organic light emitting diode OLED.

Moreover, the fifth transistor T5 is turned on, and thus, a current path is formed between the high-level source voltage VDD terminal and the reference voltage Vref terminal, whereby a voltage "Vref+a" is applied to the second node N2. Here, the voltage "a" is a voltage with the consideration of a drop of a voltage caused by the current path which is formed between the high-level source voltage VDD terminal and the reference voltage Vref terminal when the driving transistor Tdr and the fifth transistor T5 are simultaneously turned on, and the voltage of the second node N2 maintains the voltage "Vref+a" which is obtained by summating the reference voltage Vref and the voltage "a" based on a drop of a voltage. During the sampling period t3, the voltage "Vref+a" of the second node N2 is lower than the voltage "VSS+Vth_oled", and thus, the organic light emitting diode OLED maintains a turn-off state.

As a result, during the sampling period t3, the nth data voltage Vdata[n] is stored in the first capacitor C1, and thus, the data voltage of the driving transistor Tdr is sampled.

In other words, during the sampling period t3, the first capacitor C1 samples a data voltage necessary for the organic light emitting diode OLED to emit light during the emission period t4.

Each of the organic light emitting diodes included in the OLED display device according to embodiments of the present invention may start to emit light immediately after sampling of a corresponding scan line is completed, in each frame.

In other words, each organic light emitting diode starts to emit light immediately after scan operations such as initializing, sensing, and sampling are completed for each scan line. This will be described in more detail with reference to FIG. 4.

Figure 4:
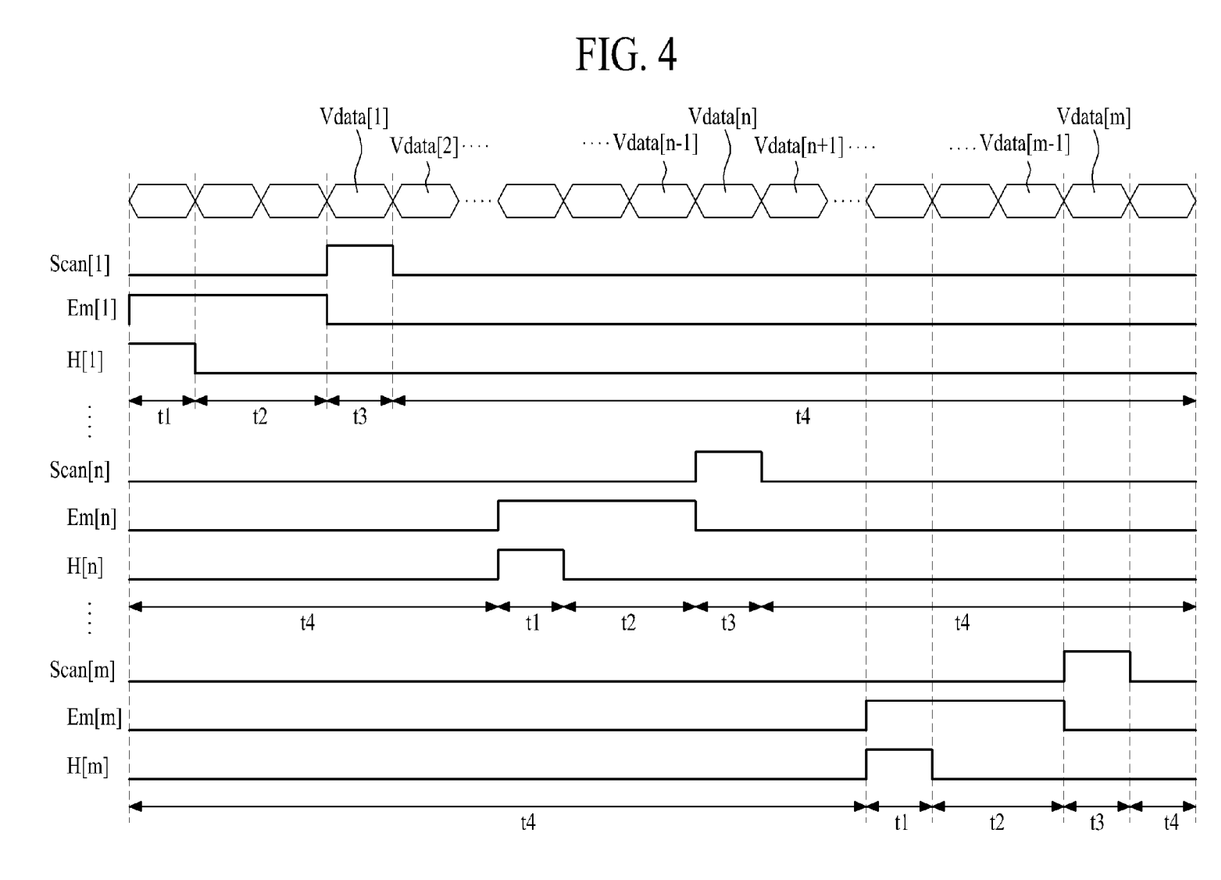
FIG. 4 is a timing chart showing in detail the timing chart of FIG. 3.

FIG. 4 is a timing chart showing in detail the timing chart of FIG. 3. In the OLED display device according to embodiments of the present invention, when it is assumed that the number of scan lines is m number, scan signals Scan[1], Scan[n] and Scan[m] are respectively applied to a first scan line, an nth scan line, and an mth scan line, and first to mth data voltages Vdata[1] to Vdata[m] are applied to one data line intersecting each scan line.

Here, a scan period for preparing for emission of light from the organic light emitting diode OLED may include the initial period t1, the sensing period t2, and the sampling period t3 for each scan line.

Thus, the OLED starts to emit light immediately after sampling of a corresponding data voltage is completed for each scan line.

Figure 5D:
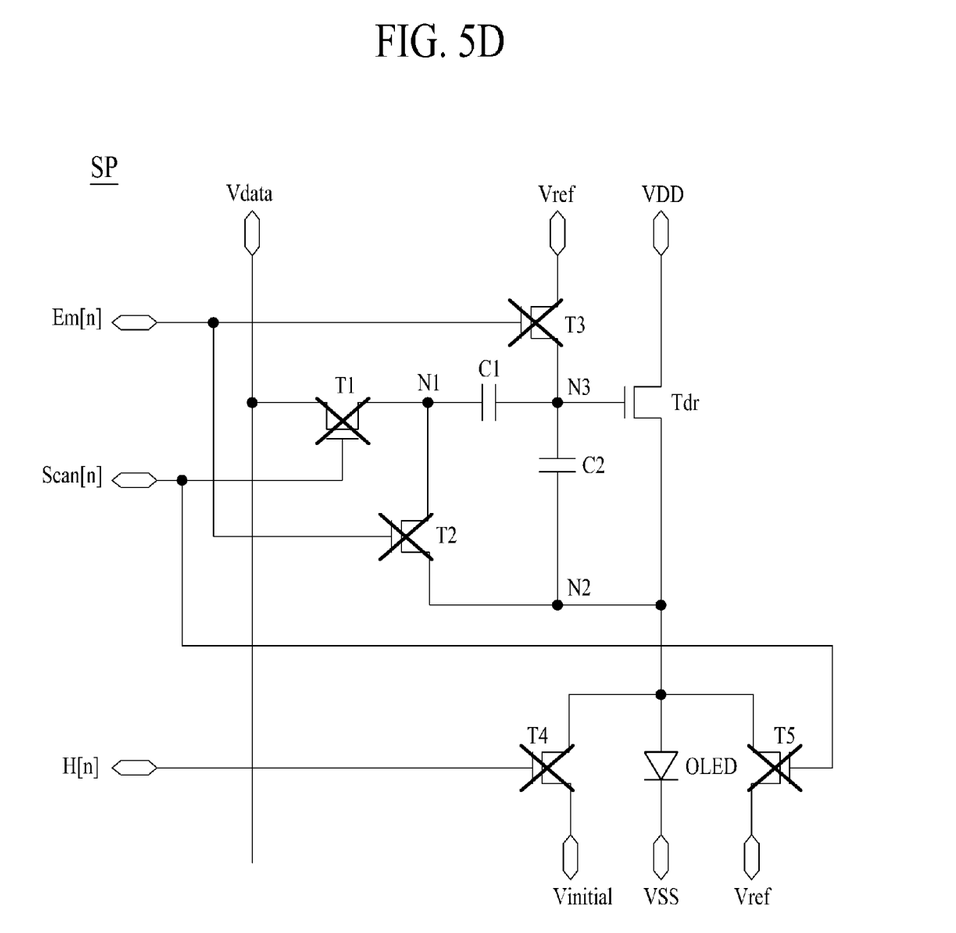

With further reference to FIG. 3, during the emission period t4, the scan signal Scan[n] having a low level and the first and second control signals Em[n] and H[n] having a low level are applied to the sub-pixel. Therefore, as illustrated in FIG. 5D, all the first to fifth transistors T1 to T5 are turned off For example, at a timing when the emission period t4 starts, the voltage of the first node N1 maintains the nth data voltage Vdata[n], the voltage of the third node N3 maintains the voltage "{Vdata[n]−(Vref−Vth)} {c1/(c1+c2)}+Vref}", and the voltage of the second node N2 maintains the voltage "Vref+a". Subsequently, since all the first to fifth transistors T1 to T5 are turned off, the voltage of each of the nodes is changed, and thus, when the voltage of the second node N2 is higher than the voltage "VSS+Vth_oled", the organic light emitting diode OLED starts to emit light.

Accordingly, the current Ioled flowing in the OLED may be decided with a current flowing in the driving transistor Tdr, and the current flowing in the driving transistor Tdr may be decided with the gate-source voltage (Vgs) of the driving transistor Tdr and the threshold voltage (Vth) of the driving transistor Tdr. The current Ioled may be defined as expressed in the following Equation (1). Also, in order to simply express an equation, the data voltage Vdata is assumed as the sum "Vdata=Va+Vref" of the reference voltage Vref and an arbitrary voltage "Va". That is, it can be seen that the arbitrary voltage "Va" is proportional to the data voltage Vdata because the reference voltage Vref is constant.

$$\begin{aligned}I_{OLED} &= K \times (Vgs - Vth)^2 \quad (1)\\&= K \times [\{Vdata[n] - (Vref - Vth)\}\{c1/(c1+c2)\} +\\&\quad Vref - Vref - a - Vth]^2\\&= K \times [\{Va - Vref - Vref + Vth)\}\{c1/(c1+c2)\} - Vth - a]^2\\&= K \times [\{Va + Vth)\}\{c1/(c1+c2)\} - Vth - a]^2\\&= K \times [Va\{c1/(c1+c2)\} - Vth\{c2/(c1+c2)\} - a]^2\\&= K \times [Va\{c1/(c1+c2)\} - a]^2\end{aligned}$$

where K denotes a proportional constant that is decided by the structure and physical properties of the driving transistor Tdr, and may be decided with the mobility of the driving transistor Tdr and the ratio "W/L" of the channel width "W" and length "L" of the driving transistor Tdr. The threshold voltage "Vth" of the driving transistor Tdr does not always have a constant value, and the deviation of the threshold voltage "Vth" occurs according to the operational state of the driving transistor Tdr. Also, the capacitance "c1" of the first capacitor C1 may be set greater than the capacitance "c2" of the second capacitor C2, and thus, a change (caused by the threshold voltage deviation of the driving transistor Tdr) in the current Ioled flowing in the organic light emitting diode OLED can be reduced.

In accordance with Equation (1), in the OLED display device according to embodiments of the present invention, the current Ioled flowing in the organic light emitting diode OLED is not be affected by the threshold voltage "Vth" of the driving transistor Tdr and the low-level source voltage VSS during the emission period t4, and may merely be determined by the arbitrary voltage "Va" proportional to the data voltage of the driving transistor Tdr.

Therefore, the OLED display device according to embodiments of the present invention minimizes an influence of the threshold voltage based on the operational state of the driving transistor, and compensates for a deviation of the low-level source voltage caused by IR drop, thereby maintaining a constant current flowing in the organic light emitting diode to prevent a quality of an image from being degraded.

In FIG. 3, it has been described above that operations of the first to fifth transistors T1 to T5 may be controlled by the different kinds of signals, having different pulse widths, such as the scan signal Scan[n] and the first and second control signals Em[n] and H[n], but in another embodiment, the signals may be signals that are generated by the same scan driver and have the same pulse width.

Hereinafter, another embodiment of signals for controlling transistors will be described with reference to FIG. 6.

Figure 6:
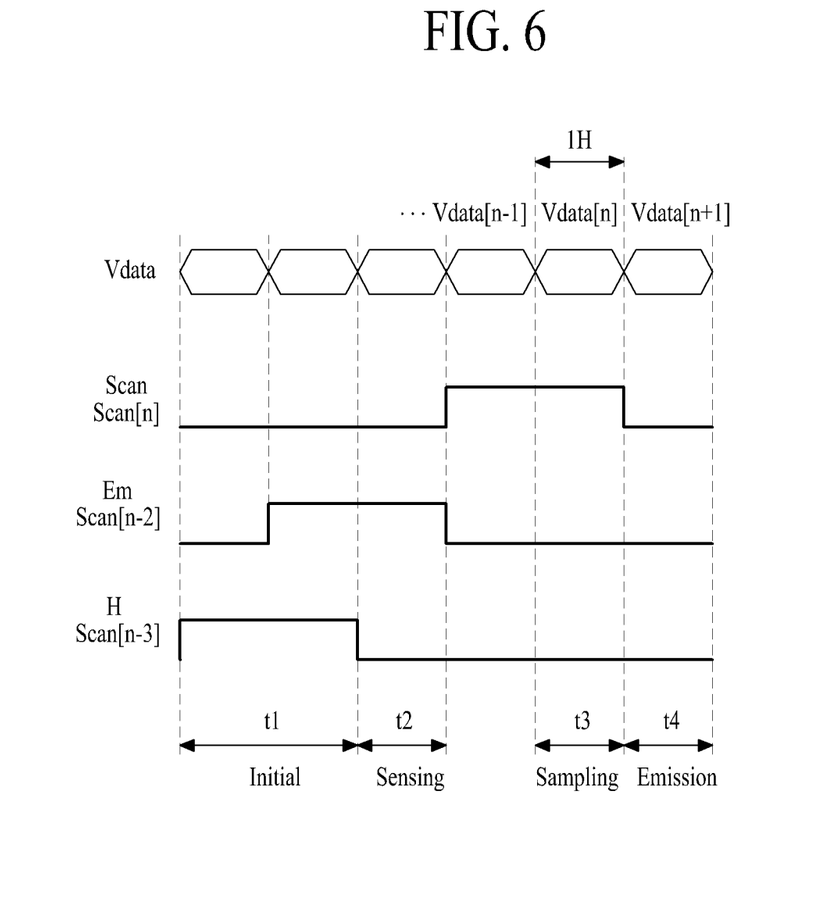
FIG. 6 is a timing chart according to another embodiment of each of control signals supplied to the equivalent circuit of FIG. 2.

FIG. 6 is a timing chart according to another embodiment of each of control signals supplied to the equivalent circuit of FIG. 2.

As shown in FIG. 6, the second control signal H, the first control signal Em, and the scan signal Scan which are used in the organic light emitting diode according to embodiments of the present invention are scan signals that are output from the same scan driver and has the same pulse width, and may respectively be an (n-3)rd scan signal Scan[n-3], an (n-2)nd scan signal Scan[n-2], and an nth scan signal Scan[n]. Also, a time in which the scan signals overlap may be adjusted by adjusting the pulse width of each of the scan signals.

That is, the signals for controlling the transistors may be respective scan signals output from one scan driver to a plurality of scan lines. Therefore, the (n-3)rd scan signal Scan[n-3] is the second control signal and is a scan signal that precedes the nth scan signal Scan[n] by three stages, and the (n-2)nd scan signal Scan[n-2] is the first control signal and is a scan signal that precedes the nth scan signal Scan[n] by two stages.

As shown in FIG. 6, during an initial period t1, the (n-3)rd scan signal Scan[n-3] having a high level may be applied as the second control signal H, the (n-2)nd scan signal Scan[n-2] having a low level may be applied as the first control signal Em, and the nth scan signal Scan[n] having a low level may be applied as the scan signal Scan.

During a sensing period t2, the (n-2)nd scan signal Scan[n-2] having a high level may be applied as the first control signal Em, the (n-3)rd scan signal Scan[n-3] having a low level may be applied as the second control signal H, and the nth scan signal Scan[n] having a low level may be applied as the scan signal Scan.

During a sampling period t3, the nth scan signal Scan[n] having a high level may be applied as the scan signal Scan, the (n-3)rd scan signal Scan[n-3] having a low level may be applied as the second control signal H, and the (n-2)nd scan signal Scan[n-2] having a low level may be applied as the first control signal Em.

During an emission period t4, the (n-3)rd scan signal Scan[n-3] having a low level, the (n-2)nd scan signal Scan[n-2] having a low level, and the nth scan signal Scan[n] having a low level may be respectively applied as the second control signal H, the first control signal Em, and the scan signal Scan.

It has been described above that the current Ioled flowing in the organic light emitting diode is not be affected by the threshold voltage "Vth" of the driving transistor Tdr and the low-level source voltage VSS, but this will be described with reference to FIGS. 7 and 8.

Figure 7:
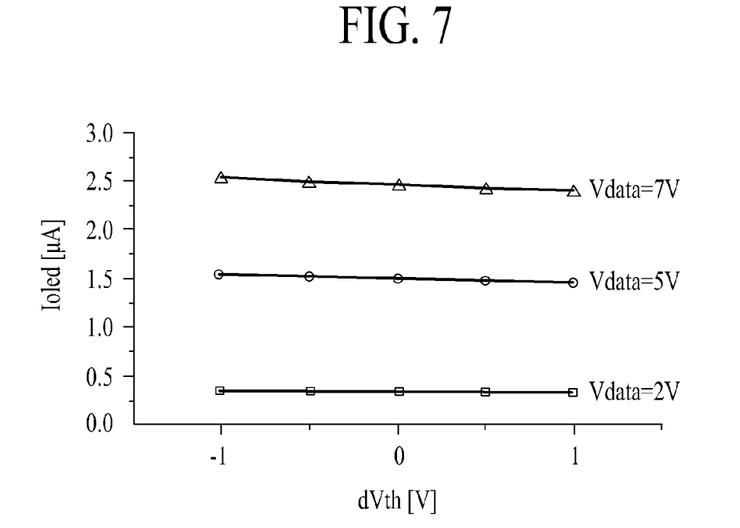
FIGS. 7 and 8 are diagrams of simulation results for describing a current change due to a threshold voltage deviation and low-level source voltage deviation of the OLED display device according to embodiments of the present invention.
Figure 8:
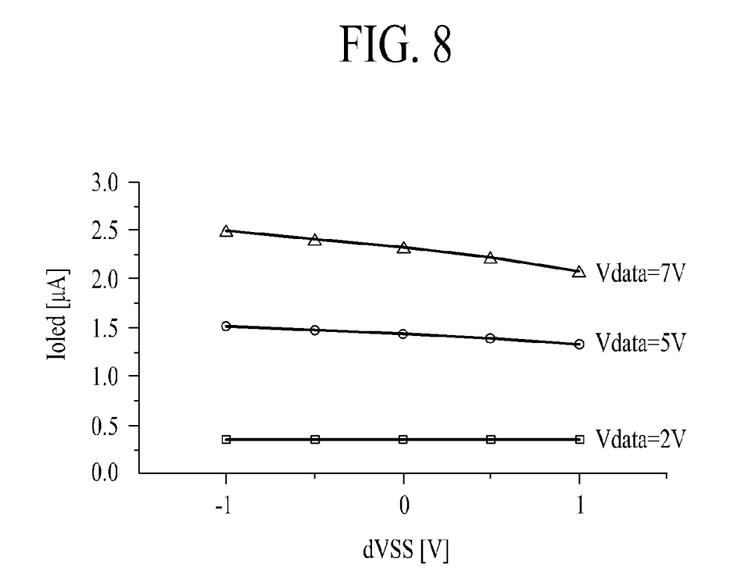

FIGS. 7 and 8 are diagrams of simulation results for describing a current change due to a threshold voltage deviation and low-level source voltage deviation of the OLED display device according to embodiments of the present invention. The simulation results are simulation results when a ratio "c1:c2" of the capacitance "c1" and the capacitance "c2" is set to "2:1".

As shown in FIG. 7, it can be seen that a level of the current Ioled flowing in the organic light emitting diode is proportional to the data voltage Vdata, but is maintained without any change irrespective of a deviation "dVth" of the threshold voltage "Vth" under the same data voltage Vdata.

Moreover, as shown in FIG. 8, it can be seen that a level of the current Ioled flowing in the organic light emitting diode is proportional to the data voltage Vdata similarly to FIG. 7, but is maintained without any change irrespective of a deviation "dVSS" of the low-level source voltage VSS under the same data voltage Vdata.

As described above, the OLED display device according to the embodiments of the present invention has the source follower structure, and thus compensates for the deviation of the threshold voltage irrespective of the polarity of the threshold voltage of the driving transistor Tdr, thereby maintaining a constant current flowing in the organic light emitting diode to prevent a quality of an image from being degraded.

Moreover, the OLED display device according to the embodiments of the present invention compensates for the deviation of the low-level source voltage caused by IR drop due to a low-level voltage, thereby maintaining a constant current flowing in the organic light emitting diode to prevent a quality of an image from being degraded.

According to the embodiments of the present invention, by compensating for the threshold voltage deviation and the low-level source voltage deviation which are caused by the operational state of the driving transistor, a current flowing in each OLED can be maintained without any change, thus preventing a degradation in image quality.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device, comprising:
    a first transistor configured to supply a data voltage to a first node according to a scan signal;
    a second transistor connected between the first node and a second node, and configured to connect the first node and the second node according to a first control signal;
    a third transistor configured to supply a reference voltage to the third node according to the first control signal;
    a fourth transistor configured to supply an initialization voltage to the second node according to a second control signal;
    a fifth transistor configured to supply the reference voltage to the second node according to the scan signal;
    a driving transistor configured to include a drain receiving a high-level source voltage, a source connected to the second node, and a gate connected to the third node;
    a first capacitor connected between the first node and the third node;
    a second capacitor connected between the second node and the third node, and configured to store a threshold voltage of the driving transistor; and
    an OLED configured to include an anode connected to the second node, wherein emission of light from the OLED is controlled according to a current flowing in the driving transistor.

2. The OLED display device of claim 1, wherein,
    the first and fifth transistors are turned on by the scan signal applied through a scan line,
    the second and third transistors are turned on by the first control signal applied through a first control line, and
    the fourth transistor is turned on by the second control signal applied through a second control line.

3. The OLED display device of claim 2, wherein when the scan signal is an nth scan signal, the first control signal is an (n-2)nd scan signal, and the second control signal is an (n-3)rd scan signal.

4. The OLED display device of claim 1, wherein,
    when the fourth transistor is turned on, the initialization voltage is applied to the second node,
    when the third transistor is turned on, the reference voltage is applied to the third node, and
    when the second transistor is turned on, the first node is connected to the second node.

5. The OLED display device of claim 1, wherein when the fourth transistor is turned off and the second and third transistors are turned on, the threshold voltage of the driving transistor is stored in the second capacitor.

6. The OLED display device of claim 1, wherein when the first and fifth transistors are turned on, the data voltage is applied to the first node, and a level of a voltage of the second node is equal to or higher than a level of the reference voltage.

7. The OLED display device of claim 1, wherein when the first to fifth transistors are turned off, the OLED emits light.

8. A method of an organic light emitting diode (OLED) display device that includes first to fifth transistors, a driving transistor, first and second capacitors, and an OLED, the method comprising:
    while the second to fourth transistors are turned on, supplying an initialization voltage to a second node connected to one end of the second capacitor, transferring the initialization voltage to a first node connected to one end of the first capacitor, and supplying a reference voltage to a third node which is connected to the other end of the first capacitor and a gate of the driving transistor;
    while the second and third transistors are turned on, storing a threshold voltage of the driving transistor in the second capacitor which is connected between the second and third nodes;
    while the first and fifth transistors are turned on, supplying a data voltage to the first node; and
    while the first to fifth transistors are turned off, emitting light from the OLED connected to the second node that is a source of the driving transistor.

9. The method of claim 8, wherein,
    the first and fifth transistors are turned on by the scan signal applied through a scan line,
    the second and third transistors are turned on by the first control signal applied through a first control line, and
    the fourth transistor is turned on by the second control signal applied through a second control line.

10. The method of claim 8, wherein the supplying of a reference voltage comprises:
    when the fourth transistor is turned on, supplying the initialization voltage to the second node;
    when the third transistor is turned on, supplying the reference voltage to the third node; and when the second transistor is turned on, connecting the first node to the second node.

11. The method of claim 8, wherein the storing of a threshold voltage comprises, when the fourth transistor is turned off and the second and third transistors are turned on, storing the threshold voltage of the driving transistor in the first and second capacitors.

12. The method of claim 8, wherein the supplying of a data voltage comprises:
   when the first transistor is turned on, supplying the data voltage to the first node; and
   when the fifth transistor is turned on, supplying a voltage equal to or higher than the reference voltage to the second node.

\* \* \* \* \*